(12) United States Patent
Hung et al.

(10) Patent No.: US 8,076,786 B2
(45) Date of Patent: Dec. 13, 2011

(54) SEMICONDUCTOR PACKAGE AND METHOD FOR PACKAGING A SEMICONDUCTOR PACKAGE

(75) Inventors: Chang Ying Hung, Kaohsiung (TW); Hsiao Chuan Chang, Kaohsiung (TW); Tsung Yueh Tsai, Kaohsiung County (TW); Yi Shao Lai, Yonghe (TW); Jian Cheng Chen, Tainan County (TW); Wei Chi Yih, Taichung (TW); Ho Ming Tong, Taipei (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 70 days.

(21) Appl. No.: 12/501,693

(22) Filed: Jul. 13, 2009

(65) Prior Publication Data

US 2010/0007011 A1    Jan. 14, 2010

Related U.S. Application Data

(60) Provisional application No. 61/079,811, filed on Jul. 11, 2008.

(30) Foreign Application Priority Data

Nov. 18, 2008   (TW) ................................ 97144458 A

(51) Int. Cl.
*H01L 23/488* (2006.01)
(52) U.S. Cl. ........ 257/786; 257/734; 257/737; 257/738; 257/779; 257/780; 257/781; 257/784; 257/787; 257/E21.508; 257/E21.175; 257/E23.02; 257/E23.021; 438/612; 438/613; 205/123
(58) Field of Classification Search ................... 257/787
See application file for complete search history.

(56) References Cited

U.S. PATENT DOCUMENTS

| | | | | |
|---|---|---|---|---|
| 5,216,278 | A | * | 6/1993 | Lin et al. ...................... 257/688 |
| 5,285,352 | A | * | 2/1994 | Pastore et al. ................. 361/707 |
| 5,476,815 | A | * | 12/1995 | Kawasumi .................... 438/613 |
| 5,642,261 | A | * | 6/1997 | Bond et al. .................... 361/704 |
| 6,069,407 | A | * | 5/2000 | Hamzehdoost ............... 257/774 |
| 6,187,615 | B1 | * | 2/2001 | Kim et al. ..................... 438/113 |
| 6,258,705 | B1 | * | 7/2001 | Chien et al. ................... 438/614 |
| 6,376,921 | B1 | * | 4/2002 | Yoneda et al. ................ 257/787 |

(Continued)

FOREIGN PATENT DOCUMENTS

CN         1568543 A     1/2005

(Continued)

OTHER PUBLICATIONS

Chinese Office Action for counterpart application No. 200910146170, mailed Nov. 9, 2010.

*Primary Examiner* — Victor A Mandala
*Assistant Examiner* — William Harriston

(57) ABSTRACT

A wire bonding structure includes a chip and a bonding wire. The chip includes a base material, at least one first metallic pad, a re-distribution layer and at least one second metallic pad. The first metallic pad is disposed on the base material. The re-distribution layer has a first end and a second end, and the first end is electrically connected to the first metallic pad. The second metallic pad is electrically connected to the second end of the re-distribution layer. The bonding wire is bonded to the second metallic pad.

20 Claims, 9 Drawing Sheets

U.S. PATENT DOCUMENTS

| | | | |
|---|---|---|---|
| 6,410,414 B1* | 6/2002 | Lee | 438/612 |
| 6,429,515 B1* | 8/2002 | Glenn | 257/734 |
| 6,498,396 B1* | 12/2002 | Arimoto | 257/737 |
| 6,511,901 B1* | 1/2003 | Lam et al. | 438/612 |
| 6,577,008 B2* | 6/2003 | Lam et al. | 257/750 |
| 6,620,633 B2* | 9/2003 | Hembree et al. | 438/14 |
| 6,747,339 B1* | 6/2004 | Mukai et al. | 257/643 |
| 6,762,117 B2* | 7/2004 | Lam et al. | 438/612 |
| 6,780,748 B2* | 8/2004 | Yamaguchi et al. | 438/612 |
| 6,873,046 B2* | 3/2005 | Akram et al. | 257/737 |
| 6,939,789 B2* | 9/2005 | Huang et al. | 438/612 |
| 7,005,737 B2* | 2/2006 | Zhao et al. | 257/707 |
| 7,211,893 B2* | 5/2007 | Alter et al. | 257/738 |
| 7,327,032 B2* | 2/2008 | Yoon | 257/737 |
| 7,425,767 B2* | 9/2008 | Lin | 257/781 |
| 7,495,317 B2* | 2/2009 | Song et al. | 257/659 |
| 7,579,217 B2* | 8/2009 | Zhao et al. | 438/122 |
| 7,632,709 B2* | 12/2009 | Jeon et al. | 438/106 |
| 7,781,870 B2* | 8/2010 | Hamamoto et al. | 257/659 |
| 2003/0089983 A1* | 5/2003 | Huang et al. | 257/738 |
| 2003/0109079 A1* | 6/2003 | Yamaguchi et al. | 438/107 |
| 2004/0040855 A1* | 3/2004 | Batinovich | 205/123 |
| 2004/0164408 A1* | 8/2004 | Yang | 257/724 |
| 2004/0191955 A1* | 9/2004 | Joshi et al. | 438/106 |
| 2004/0245630 A1* | 12/2004 | Huang et al. | 257/737 |
| 2005/0023657 A1* | 2/2005 | Tsai et al. | 257/678 |
| 2005/0032348 A1* | 2/2005 | Farnworth et al. | 438/613 |
| 2005/0054155 A1* | 3/2005 | Song et al. | 438/238 |
| 2005/0127505 A1* | 6/2005 | Alter | 257/734 |
| 2005/0133571 A1* | 6/2005 | Chuang | 228/180.5 |
| 2005/0133935 A1* | 6/2005 | Vasishta et al. | 257/782 |
| 2005/0194674 A1* | 9/2005 | Thomas et al. | 257/690 |
| 2007/0090539 A1* | 4/2007 | Hosseini et al. | 257/784 |
| 2007/0152693 A1* | 7/2007 | Yang et al. | 324/763 |
| 2007/0215992 A1* | 9/2007 | Shen et al. | 257/668 |
| 2007/0252275 A1* | 11/2007 | Huang et al. | 257/737 |
| 2008/0128884 A1* | 6/2008 | Meyer et al. | 257/686 |
| 2008/0157402 A1* | 7/2008 | Ramakrishna et al. | 257/787 |
| 2008/0160682 A1* | 7/2008 | Song et al. | 438/132 |
| 2008/0185737 A1* | 8/2008 | Marimuthu | 257/780 |
| 2008/0203575 A1* | 8/2008 | Thomas et al. | 257/762 |
| 2008/0224329 A1* | 9/2008 | Schwab et al. | 257/783 |
| 2008/0230877 A1* | 9/2008 | Chung et al. | 257/666 |
| 2008/0246113 A1* | 10/2008 | Baek et al. | 257/529 |
| 2008/0315436 A1* | 12/2008 | Mueller et al. | 257/778 |
| 2009/0065950 A1* | 3/2009 | Lee et al. | 257/777 |
| 2009/0087951 A1* | 4/2009 | Jeon et al. | 438/118 |
| 2009/0184411 A1* | 7/2009 | Chung et al. | 257/691 |
| 2009/0302478 A1* | 12/2009 | Pagaila et al. | 257/774 |
| 2010/0052131 A1* | 3/2010 | Tay et al. | 257/686 |

FOREIGN PATENT DOCUMENTS

| | | |
|---|---|---|
| CN | 1828890 A | 9/2006 |
| CN | 1925146 A | 3/2007 |

* cited by examiner

SEMICONDUCTOR PACKAGE AND METHOD FOR PACKAGING A SEMICONDUCTOR PACKAGE

CROSS REFERENCE TO RELATED APPLICATION

This application claims the priority benefit of U.S. patent application Ser. No. 61/079,811, filed on Jul. 11, 2008 and Taiwan Patent Application Serial Number 097144458, filed on Nov. 18, 2008, the full disclosure of which is incorporated herein by reference.

BACKGROUND OF THE INVENTION

1. Field of the Invention

The present invention generally relates to a method for packaging a semiconductor package, and more particularly to a wire bonding structure of a semiconductor package, wherein the property of new and suitable metallic pad can be selected by designing a re-distribution layer, thereby replacing the property of original metallic pad.

2. Description of the Related Art

Referring to FIG. 1, according to a process for manufacturing a semiconductor package, the technology of wire bonding process widely applied to the electrical connection between a pad 11 of a chip 10 and a pad 13 of a substrate 12 by using a bonding wire 14. Wire bonding process is mainly based on gold (Au) wires, but copper (Cu) wire has an advantage of low cost. Compared with the gold, the copper has better electric conductivity and thermal conductivity, whereby the copper bonding wire has thinner diameter of wire and better dissipation of heat. However, the copper has disadvantage of insufficient ductility and easy oxidation such that the utilization of the copper bonding wire is restricted.

Recently, the copper bonding wire is only applied to a chip pad with a big size or low dielectric material (low-k) of wafer, because the success of the wire bonding process of the copper bonding wire depends on the structural strength of the chip pad. In order to avoid the failure of the wire bonding process of the copper bonding wire, the small size of the chip pad will be limited.

Referring to FIGS. 2 to 4, they depict a conventional method for bonding a copper bonding wire. Referring to FIG. 2, a copper bonding wire 20 is provided by a wire bonding machine, wherein the copper bonding wire 20 has a copper line 22 and a copper ball 24. The copper ball 24 is physically connected to an end of the copper line 22 by a discharging electricity manner or a burning hydrogen manner. Referring to FIG. 3, the copper ball 24 is pressed and then deformed. Referring to FIG. 4, the deformed copper ball 24 is bonded to an aluminum (Al) pad 32 by a vibration process. However, the hardness of the copper is higher than that of the aluminum, and thus the force resulted from the copper bonding wire 20 possibly damages the structure of the aluminum pad 32 during the pressing process.

A re-distribution layer (RDL) is mainly applied to the solder ball bonding process of a wafer level chip scale package (WLCSP) or the bump bonding process of a flip chip. However, the re-distribution layer is not applied to the wire bonding process yet.

Accordingly, there exists a need for wire bonding structure of a semiconductor package capable of solving the above-mentioned problems.

SUMMARY OF THE INVENTION

The present invention provides a wire bonding structure a semiconductor package including a chip and a bonding wire. The chip includes a base material, at least one first metallic pad, a re-distribution layer and at least one second metallic pad. The first metallic pad is disposed on the base material. The re-distribution layer has a first end and a second end, and the first end is electrically connected to the first metallic pad. The second metallic pad is electrically connected to the second end of the re-distribution layer. The bonding wire is bonded to the second metallic pad.

According to the wire bonding structure of the present invention, the property of new and suitable metallic pad can be selected by designing the re-distribution layer, thereby replacing the property of original metallic pad. For example, the second metallic pad can be selected from the material (e.g. copper material) whose hardness is higher than that of the first metallic pad (e.g. aluminum pad) by designing the re-distribution layer. Thus, the force resulted from the bonding wire (e.g. copper bonding wire) will not damage the structure of the first metallic pad (e.g. aluminum pad) during the pressing process of the method for bonding a wire. Furthermore, the second metallic pad can be selected from the material (e.g. copper material) which is easily bonded to the bonding wire for increasing the bonding force therebetween. In addition, the size of the second metallic pad can be designed and bigger than that of the first metallic pad by designing the re-distribution layer, thereby acquiring bigger bonding area between the bonding wire and the chip for increasing the bonding force therebetween. In addition, the plurality of second metallic pads can be arranged along the second arrangement direction (e.g. the direction of non-straight line) by designing the re-distribution layer, whereby there is a fine pitch between two adjacent second metallic pads for increasing the number of input/output contacts.

The foregoing, as well as additional objects, features and advantages of the invention will be more apparent from the following detailed description, which proceeds with reference to the accompanying drawings.

DETAILED DESCRIPTION OF THE PREFERRED EMBODIMENT

Figure 1:
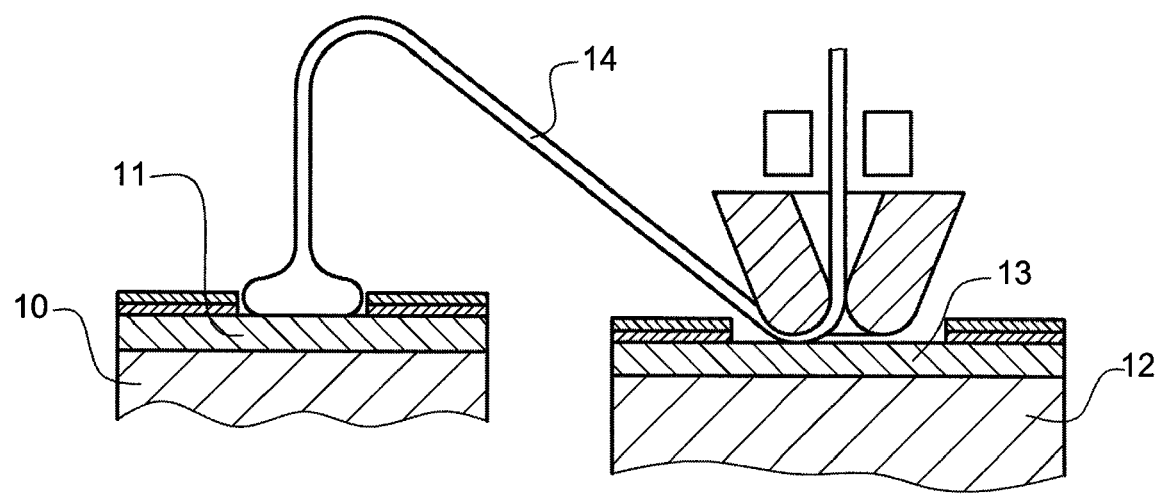
FIG. 1 is a cross-sectional view showing a method for bonding a wire in the prior art.
Figure 2:
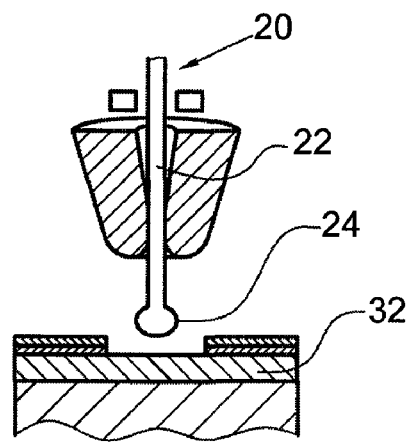
FIGS. 2 to 4 are cross-sectional views showing a method for bonding a copper bonding wire in the prior art.
Figure 3:
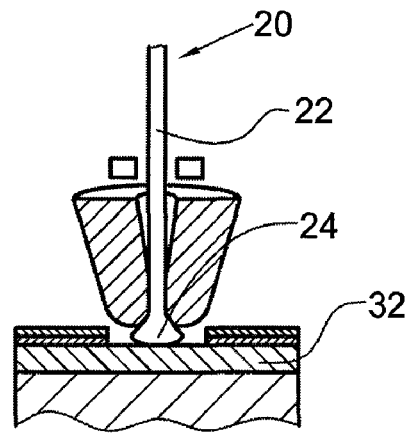
Figure 4:
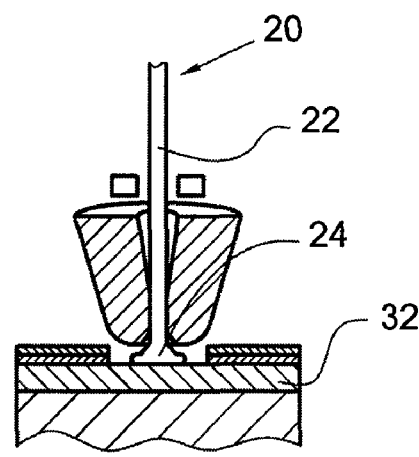
Figure 5:
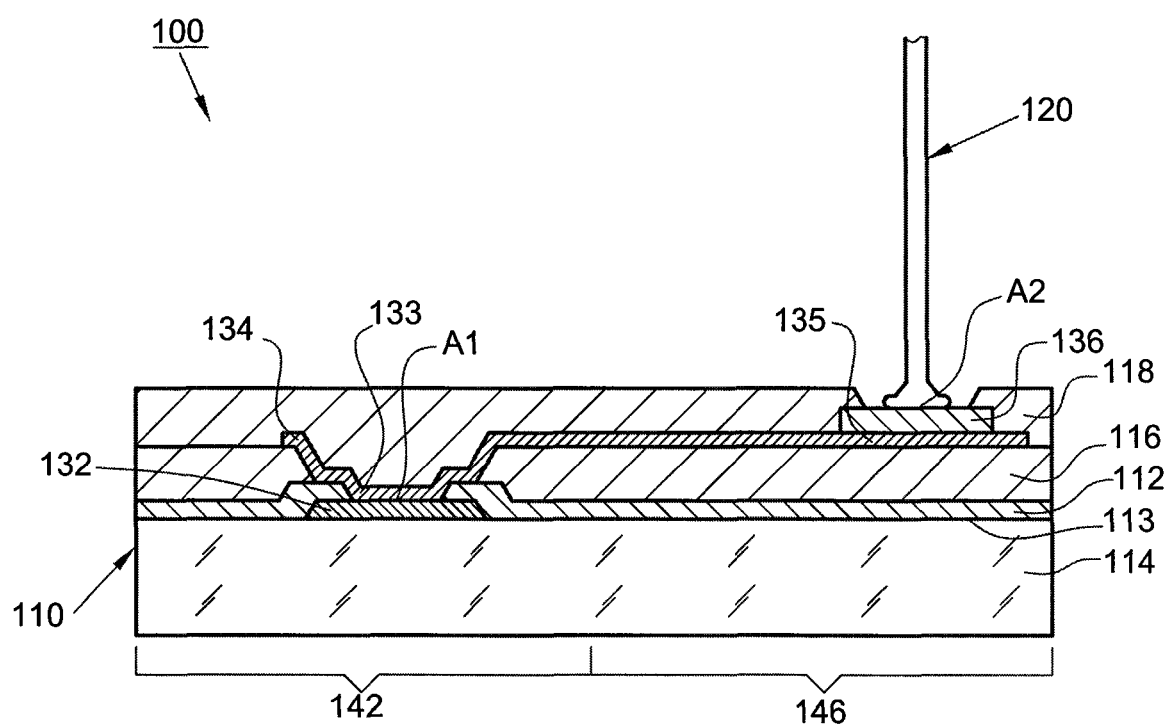
FIG. 5 is a wire bonding structure according to an embodiment of the present invention.

Referring to FIG. 5, it depicts a wire bonding structure 100 of a semiconductor package according to an embodiment of the present invention. The wire bonding structure 100 includes a chip 110 and a bonding wire 120. The chip 110 includes a base material 114, at least one first metallic pad 132, a passivation layer 112, a first dielectric layer 116, a re-distribution layer (RDL) 134, at least one second metallic pad 136 and a second dielectric layer 118. The base material 114 can be a silicon material. The first metallic pad 132 is disposed on the base material 114. The passivation layer 112 (e.g. nitrides) covers the first metallic pad 132 and the base material 114 and exposes a part of the first metallic pad 132, whereby the first metallic pad 132 has an exposed area A1. The first dielectric layer 116, e.g. benzocyclobutene (BCB), covers the passivation layer 112 and exposes the exposed area A1 of the first metallic pad 132. The re-distribution layer 134 is disposed on the first dielectric layer 116 and has a first end 133 is electrically connected to the exposed area A1 of the first metallic pad 132. The re-distribution layer 134 can be a metallic trace layer, e.g. under bump metallization (UBM). The second metallic pad 136 is electrically connected to the second end 135 of the re-distribution layer 134. The second dielectric layer 118, e.g. benzocyclobutene (BCB), covers the first dielectric layer 116, the re-distribution layer 134 and the second metallic pad 136, and exposes a part of the second metallic pad 136, whereby the second metallic pad 136 has an exposed area A2. The bonding wire 120 is bonded to the exposed area A2 of the second metallic pad 136 so as to form the wire bonding structure of the prevent invention.

In this embodiment, the bonding wire 120 can be made of non-gold material, e.g. bonding wire made of cupper, and the hardness of the cupper bonding wire is higher than that of gold. The second metallic pad 136 can be selected from the material whose hardness is higher than that of the first metallic pad 132 or the material which is easily bonded to the bonding wire 120 by designing the re-distribution layer 134. For example, if the first metallic pad 132 is made of aluminum and the bonding wire 120 is made of copper, the second metallic pad 136 can be selected from the copper material so as to acquire a copper pad whose hardness is higher than that of the aluminum pad or the material which is easily bonded to the bonding wire.

Figure 6:
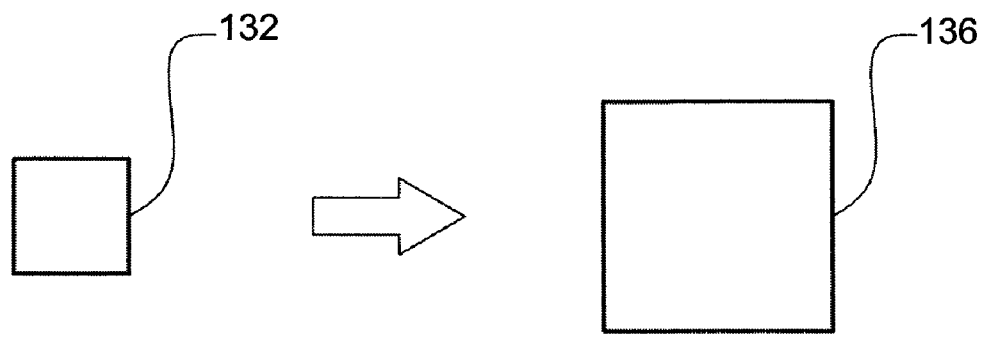
FIG. 6 is the first and second metallic pads of the wire bonding structure according to the embodiment of the present invention.
Figure 6:
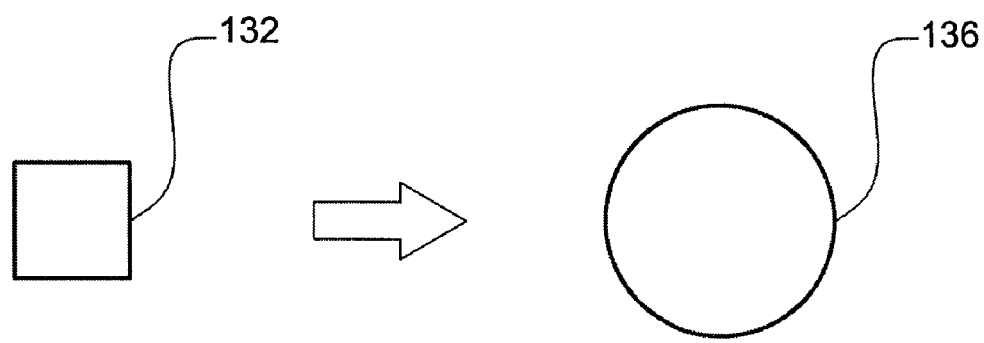
Figure 6:
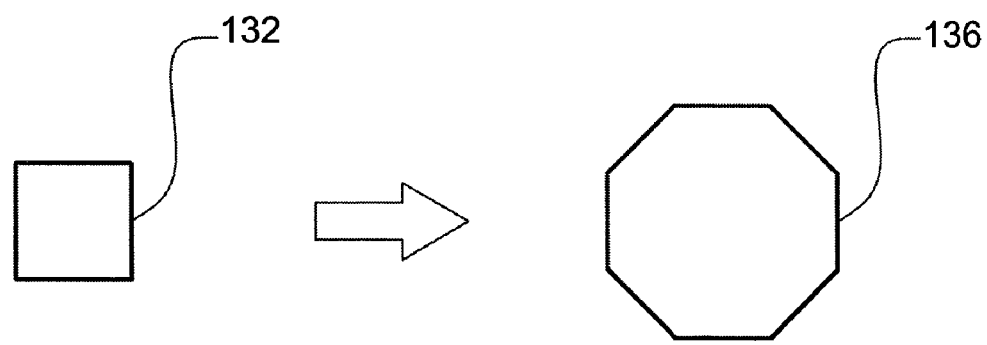

Referring to FIG. 6, in this embodiment the size of the second metallic pad 136 can be designed and bigger than that of the first metallic pad 132 by designing the re-distribution layer 134. In other words, the exposed area of the second metallic pad 136 is bigger than that of the first metallic pad 132 so as to acquiring more bonding area between the bonding wire 120 and the chip 110. The shape of the second metallic pad 136 can be designed to rectangle, circle, octangle, etc. if necessary.

Figure 7:
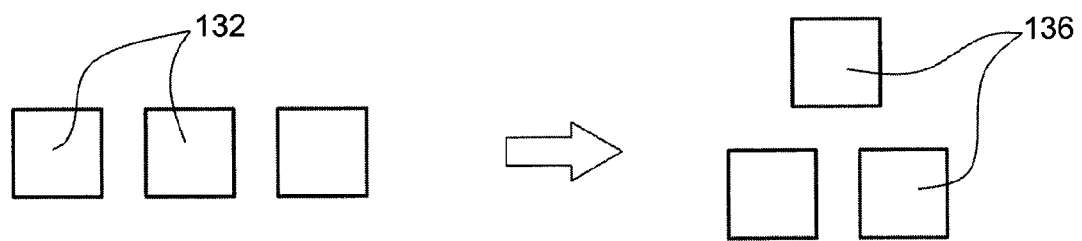
FIG. 7 is the first and second metallic pads of the wire bonding structure according to another embodiment of the present invention.
Figure 7:
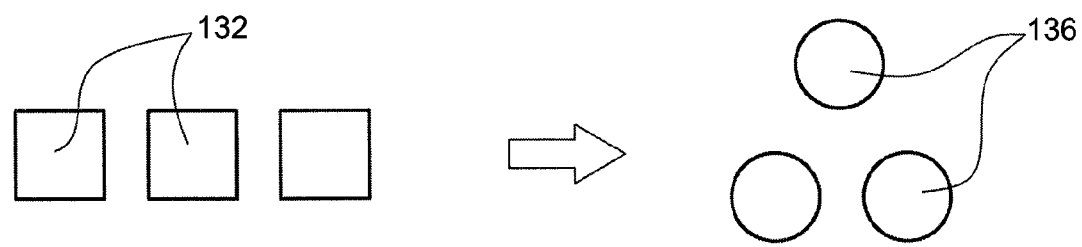
Figure 7:
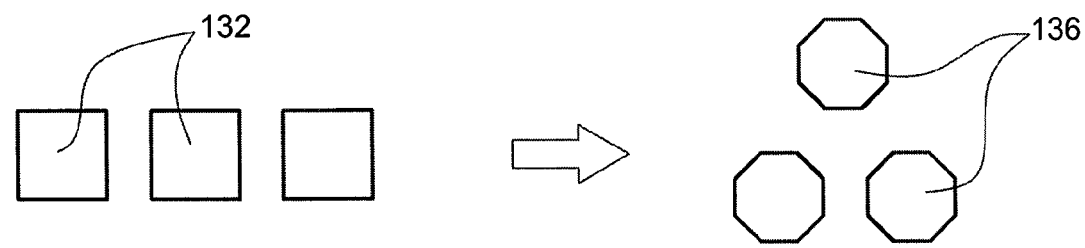

Referring to FIG. 7, in another embodiment the chip 110 includes a plurality of first metallic pads 132 which are arranged in the first arrangement direction (e.g. the direction of straight line). The chip 110 also includes a plurality of second metallic pads 136 which are arranged in the second arrangement direction (e.g. the direction of non-straight line) by designing the re-distribution layer 134, whereby there is a fine pitch between two adjacent second metallic pads 136.

According to the wire bonding structure of the present invention, the property of new and suitable metallic pad can be selected by designing the re-distribution layer, thereby replacing the property of original metallic pad. For example, the second metallic pad can be selected from the material (e.g. copper material) whose hardness is higher than that of the first metallic pad (e.g. aluminum pad) by designing the redistribution layer. Thus, the force resulted from the bonding wire (e.g. copper bonding wire) will not damage the structure of the first metallic pad (e.g. aluminum pad) during the pressing process of the method for bonding a wire. Furthermore, the second metallic pad can be selected from the material (e.g. copper material) which is easily bonded to the bonding wire for increasing the bonding force therebetween. In addition, the size of the second metallic pad can be designed and bigger than that of the first metallic pad by designing the re-distribution layer, thereby acquiring bigger bonding area between the bonding wire and the chip for increasing the bonding force therebetween. In addition, the plurality of second metallic pads can be arranged along the second arrangement direction (e.g. the direction of non-straight line) by designing the re-distribution layer, whereby there is a fine pitch between two adjacent second metallic pads for increasing the number of input/output contacts.

Referring FIG. 5 again, the base material 114 has a surface 113 which defines a component region 142 and a non-component region 146. The first metallic pad 132 are located on the component region 142 and electrically connected to a circuit of the component region 142. The second metallic pad 136 are designed and located on the non-component region 146 by designing the re-distribution layer 134. Thus, the force resulted from the bonding wire 120 (e.g. copper bonding wire) focuses on the non-component region 146 and will not damage the circuit of the component region 142 during the pressing process of the method for bonding a wire.

Figure 8:
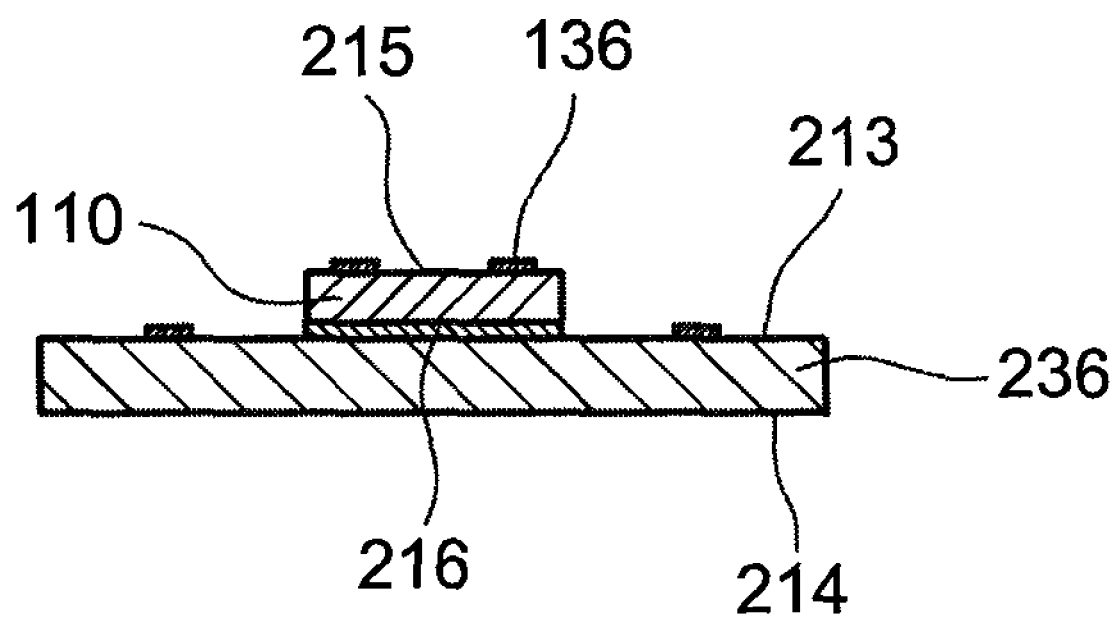
FIGS. 8 to 13 are cross-sectional views showing a method for bonding a wire according to an embodiment of the present invention.
Figure 9:
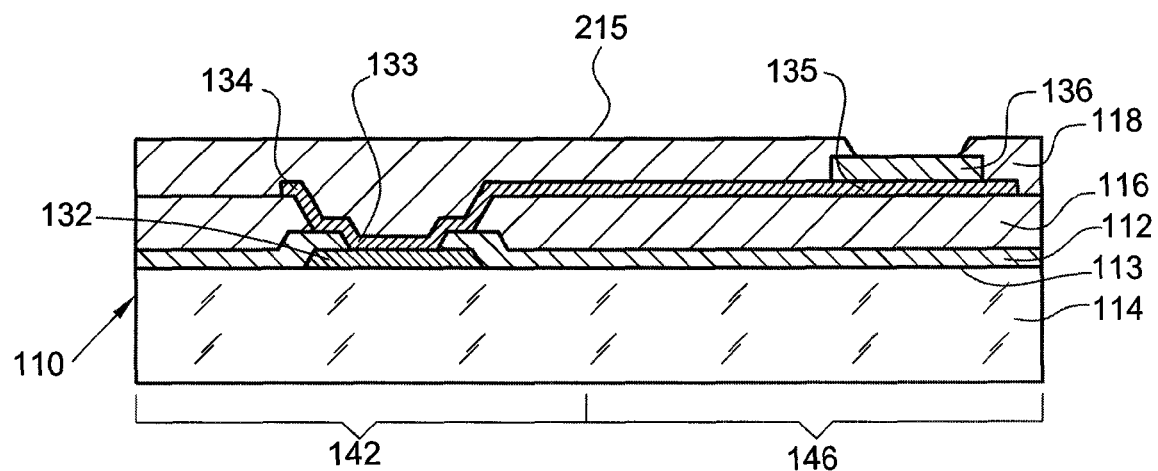

Referring to FIGS. 8 to 13, they depict a method for packaging a semiconductor package according to an embodiment of the present invention. Referring to FIG. 8, a carrier 236 is provided, wherein the carrier 236 has an upper surface 213 and a lower surface 214 opposite to the upper surface 213. A chip 110 is disposed on the carrier 236, wherein the chip 110 has an active surface 215 and a back surface 216 opposite to the active surface 215, and the back surface 216 of the chip 110 is located on the upper surface 213 of the carrier 236. Referring to FIG. 9, the chip 110 includes at least one first metallic pad 132, re-distribution layer 134 and at least one second metallic pad 136. The re-distribution layer 134 has a first end 133 and a second end 135, and the first end 133 is electrically connected to the first metallic pad 132. The second metallic pad 136 is electrically connected to the second end 135 of the re-distribution layer 134. The second metallic pad 136 is disposed on the active surface 215 of the chip 110.

Figure 10:
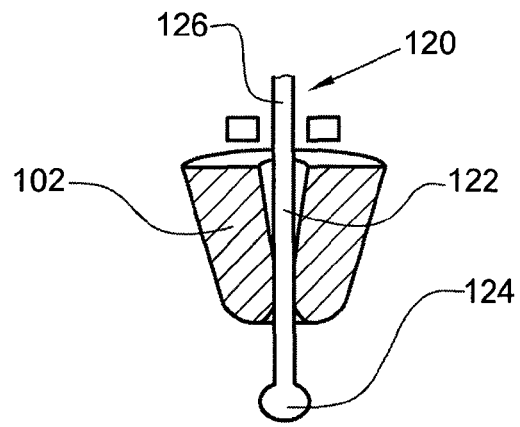
Figure 11:
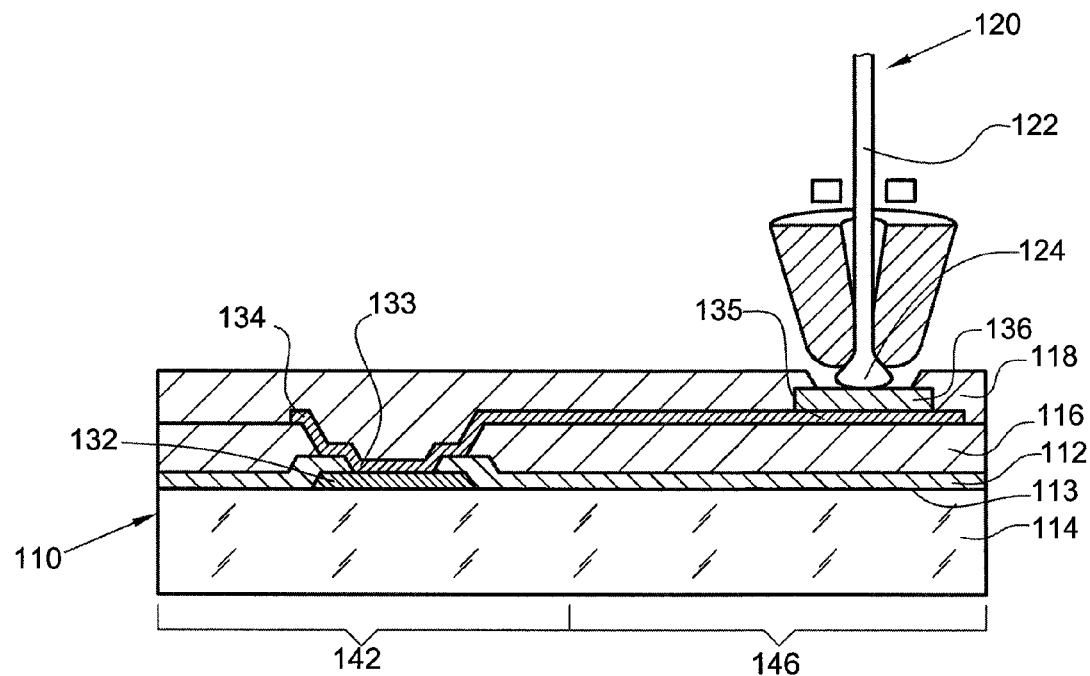
Figure 12:
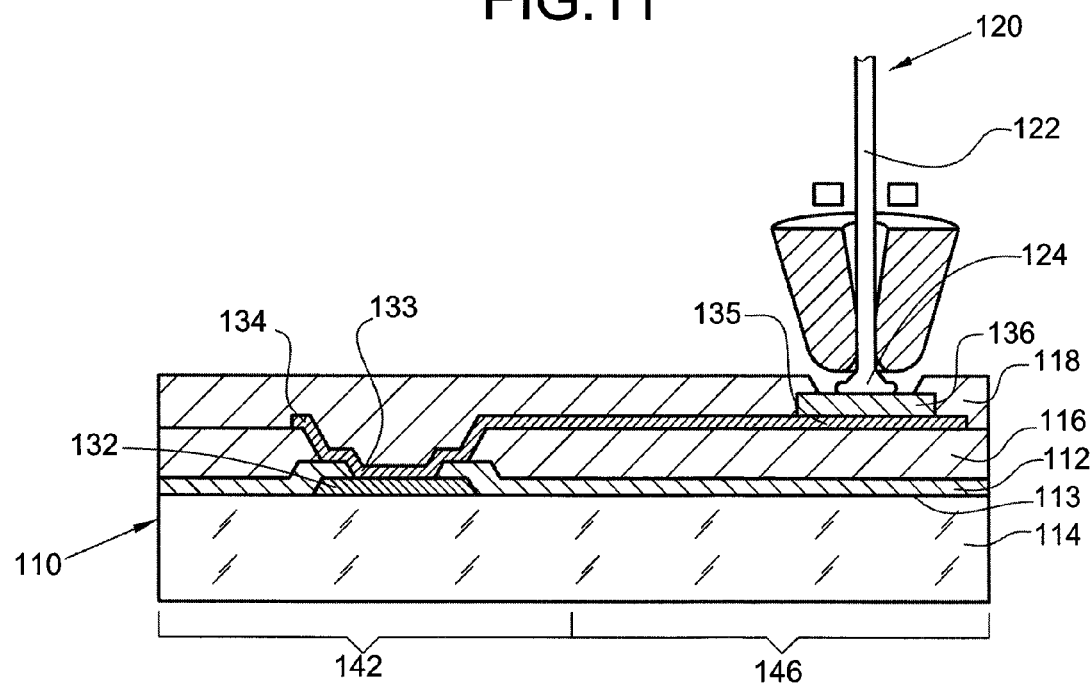

Referring to FIG. 10, a bonding wire 120 (e.g. copper bonding wire) is provided by a wire bonding machine 102, wherein the copper bonding wire 120 has a line portion 122 and a block portion 124, the block portion 124 is physically connected to an end of the line portion 122, and the cross-sectional area of the block portion 124 is bigger than that of the line portion 122. The block portion 124 can be spherical. For example, the block portion 124 is physically connected to an end of the line portion 122 by a discharging electricity manner or a burning hydrogen manner. Referring to FIG. 11, the block portion 124 contact the second metallic pad 136, and the block portion 124 is pressed and then deformed by a pressing process. Referring to FIG. 12, the block portion 124 of the copper bonding wire 120 is bonded to the second metallic pad 136 by a vibration process, so as to finish a method for bonding a bonding wire of the present invention and form a wire bonding structure 100 of the present invention.

Figure 13:
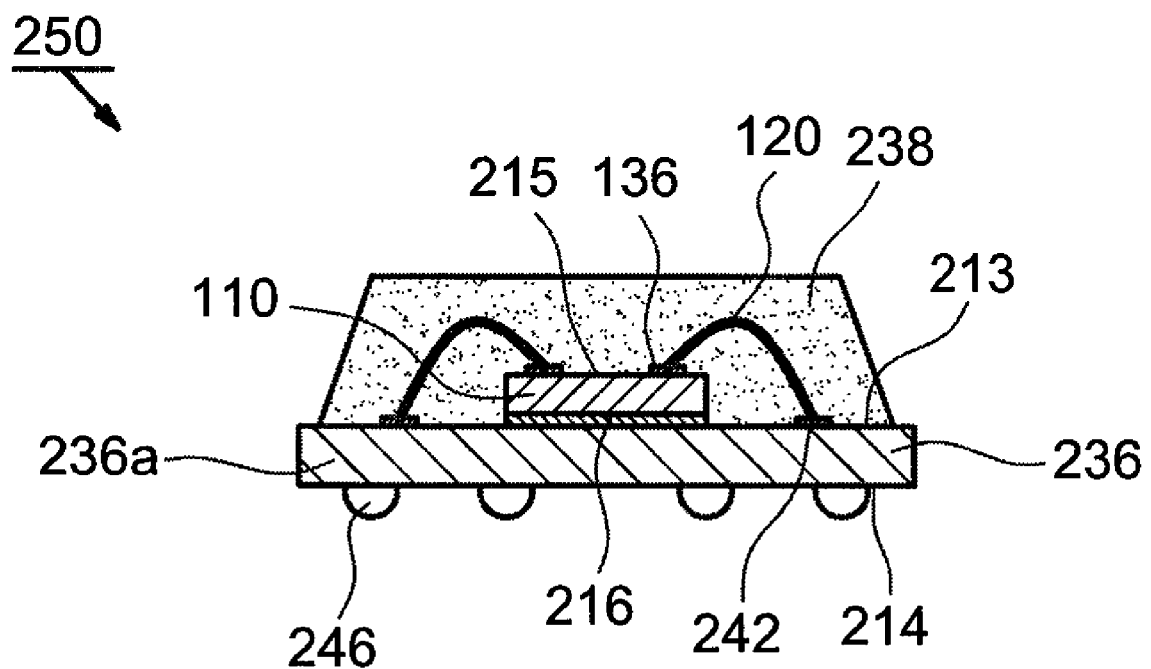

In addition, the carrier 236 can be a substrate or a leadframe. Referring to FIG. 13, in this embodiment, the carrier 236 can be a substrate 236a. The wire bonding structure of the present invention can be applied to a semiconductor package, i.e. the second metallic pad 136 can be a chip pad, one end of the copper bonding wire 120 is electrically connected to the chip pad, and the other end of the copper bonding wire 120 is electrically connected to a substrate pad 242. The substrate 236a includes external electrical contacts 246 located on the lower surface 214.

Referring to FIG. 13 again, finally the chip 110 and the copper bonding wire 120 are sealed, and the carrier 236 is covered by a molding compound 238 so as to form a package, i.e. a semiconductor package 250 of the present invention.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A semiconductor package comprising:
    a carrier;
    a chip disposed on the carrier, wherein the chip has a first surface and a second surface opposite to the first surface, and the chip comprises:
        a base material;
        a plurality of first metallic pads, one of the first metallic pads being disposed on the base material;
        a re-distribution layer having a first end and a second end, wherein the first end is electrically connected to the one of the first metallic pads; and
        a plurality of second metallic pads, one of the second metallic pads being electrically connected to the second end of the re-distribution layer and disposed on the first surface;
    a bonding wire for electrically connecting the chip to the carrier, wherein the bonding wire is bonded to the one of the second metallic pads, the bonding wire is made of non-gold material, and the hardness of the bonding wire is higher than that of gold; and
    a molding compound for sealing the chip and the bonding wire and covering the carrier,
    wherein the first metallic pads are arranged in a first arrangement direction, the second metallic pads are arranged in a second arrangement direction, and the second arrangement direction is different from the first arrangement direction.

2. The semiconductor package as claimed in claim 1, wherein the chip further comprising:
    a passivation layer covering the one of the first metallic pads and the base material and exposes a part of the one of the first metallic pads, whereby the one of the first metallic pads has an exposed area;
    a first dielectric layer covering the passivation layer and exposes the exposed area of the one of the first metallic pads, wherein the re-distribution layer is disposed on the first dielectric layer, and the first end is electrically connected to the exposed area of the one of the first metallic pads; and
    a second dielectric layer covering the first dielectric layer, the re-distribution layer and the one of the second metallic pads, and exposes a part of the one of the second metallic pads, whereby the one of the second metallic pads has an exposed area, wherein the bonding wire is bonded to the exposed area of the one of the second metallic pads.

3. The semiconductor package as claimed in claim 2, wherein the exposed area of the one of the second metallic pads is bigger than that of the one of the first metallic pads.

4. The semiconductor package as claimed in claim 1, wherein the size of the one of the second metallic pads is different from that of the one of the first metallic pads.

5. The semiconductor package as claimed in claim 4, wherein the size of the one of the second metallic pads is bigger than that of the one of the first metallic pads.

6. The semiconductor package as claimed in claim 1, wherein the base material has a surface which defines a component region and a non-component region, the one of the first metallic pads is located on the component region, and the one of the second metallic pads is located on the non-component region.

7. The semiconductor package as claimed in claim 1, wherein the hardness of the one of the second metallic pads is higher than that of the one of the first metallic pads.

8. The semiconductor package as claimed in claim 1, wherein the one of the first metallic pads is made of aluminum, the one of the second metallic pads is made of copper, and the bonding wire is made of copper.

9. The semiconductor package as claimed in claim 1, wherein the first arrangement direction is the direction of straight line, and the second arrangement direction is the direction of non-straight line.

10. The semiconductor package as claimed in claim 1, wherein the re-distribution layer is a metallic trace layer.

11. The semiconductor package as claimed in claim 1, wherein the re-distribution layer is an under bump metallization (UBM).

12. A method for packaging a semiconductor package comprising:
    deposing a chip on a carrier, wherein the chip has a first surface and a second surface opposite to the first surface, and the chip comprises: a plurality of first metallic pads, a plurality of second metallic pads, and a re-distribution layer, the re-distribution layer has a first end and a second end, the first end is electrically connected to one of the first metallic pads, the second end of the re-distribution layer is electrically connected to one of the second metallic pads, and the one of the second metallic pads is disposed on the first surface;
    electrically connecting the chip to the carrier by a bonding wire, wherein the bonding wire is bonded to one of the second metallic pads, the bonding wire is made of non-gold material, and the hardness of the bonding wire is higher than that of gold; and
    sealing the chip and the bonding wire and covering the carrier by a molding compound, so as to form a package, wherein the first metallic pads are arranged in a first arrangement direction, the second metallic pads are arranged in a second arrangement direction, and the second arrangement direction is different from the first arrangement direction.

13. The method as claimed in claim 12, wherein the size of the one of the second metallic pads is bigger than that of the one of the first metallic pads.

14. The method as claimed in claim 12, wherein the base material has a surface which defines a component region and a non-component region, the one of the first metallic pads is located on the component region, and the one of the second metallic pads is located on the non-component region.

15. The method as claimed in claim 12, wherein the hardness of the one of the second metallic pads is higher than that of the one of the first metallic pads.

16. The method as claimed in claim 12, wherein the one of the first metallic pads is made of aluminum, the one of the second metallic pads is made of copper, and the bonding wire is made of copper.

17. A semiconductor package comprising:
    a carrier;
    a chip disposed on the carrier, wherein the chip has a first surface and a second surface opposite to the first surface, and the chip comprises:
        a base material;
        a plurality of first metallic pads, one of the first metallic pads being disposed on the base material;

a re-distribution layer having a first end and a second end, wherein the first end is electrically connected to the one of the first metallic pads; and a plurality of second metallic pads, one of the second metallic pads being electrically connected to the second end of the re-distribution layer and disposed on the first surface;

a bonding wire for electrically connecting the chip to the carrier, wherein the bonding wire is bonded to the one of the second metallic pads; and a molding compound for sealing the chip and the bonding wire and covering the carrier, wherein the first metallic pads are arranged in a direction of straight line, the second metallic pads are arranged in a direction of non-straight line different from the direction of straight line.

18. The semiconductor package as claimed in claim 17, wherein the size of the one of the second metallic pads is different from that of the one of the first metallic pads.

19. The semiconductor package as claimed in claim 17, wherein the base material has a surface which defines a component region and a non-component region, the one of the first metallic pads is located on the component region, and the one of the second metallic pads is located on the non-component region.

20. The semiconductor package as claimed in claim 17, wherein the hardness of the one of the second metallic pads is higher than that of the one of the first metallic pads.

* * * * *